United States Patent
Yang et al.

(10) Patent No.: US 10,453,385 B2
(45) Date of Patent: Oct. 22, 2019

(54) AMOLED PIXEL UNIT AND DRIVING METHOD THEREFOR, AND AMOLED DISPLAY APPARATUS

(71) Applicants: KUNSHAN NEW FLAT PANEL DISPLAY TECHNOLOGY CENTER CO., LTD., KunShan, Jiangsu (CN); KUNSHAN GO-VISIONOX OPTO-ELECTRONICS CO., LTD., KunShan (CN)

(72) Inventors: Nan Yang, KunShan (CN); Hui Zhu, KunShan (CN); Siming Hu, KunShan (CN); Xiuqi Huang, KunShan (CN)

(73) Assignees: KUNSHAN NEW FLAT PANEL DISPLAY TECHNOLOGY CENTER CO., LTD., Kunshan, Jiangsu (CN); KUNSHAN GO-VISIONOX OPTO-ELECTRONICS CO., LTD., Kunshan, Jiangsu (CN)

( * ) Notice: Subject to any disclaimer, the term of this patent is extended or adjusted under 35 U.S.C. 154(b) by 0 days.

(21) Appl. No.: 15/514,796

(22) PCT Filed: Sep. 23, 2015

(86) PCT No.: PCT/CN2015/090361
§ 371 (c)(1),
(2) Date: Mar. 27, 2017

(87) PCT Pub. No.: WO2016/045590
PCT Pub. Date: Mar. 31, 2016

(65) Prior Publication Data
US 2017/0213504 A1 Jul. 27, 2017

(30) Foreign Application Priority Data
Sep. 28, 2014 (CN) .......................... 2014 1 0508539

(51) Int. Cl.
*G09G 3/3225* (2016.01)
*G09G 3/3266* (2016.01)
(Continued)

(52) U.S. Cl.
CPC ......... *G09G 3/3225* (2013.01); *G09G 3/3233* (2013.01); *G09G 3/3266* (2013.01);
(Continued)

(58) Field of Classification Search
CPC ..................................................... G09G 3/3225
(Continued)

(56) References Cited

U.S. PATENT DOCUMENTS

2006/0145967 A1 7/2006 Huh
2010/0220093 A1 9/2010 Choi
(Continued)

FOREIGN PATENT DOCUMENTS

CN 102346999 A 2/2012
CN 102708792 A 10/2012
(Continued)

*Primary Examiner* — Long D Pham
(74) *Attorney, Agent, or Firm* — Muncy, Geissler, Olds & Lowe, P.C.

(57) ABSTRACT

An AMOLED pixel unit (20) and a driving method therefore, as well as an AMOLED display device including the AMOLED pixel unit (20), are disclosed. The AMOLED pixel unit (20) includes a pixel circuit (22) and an organic light-emitting diode (24) connected to the pixel circuit (22). The pixel circuit (22) includes a capacitor (Cs), an initialization unit connected to one terminal of the capacitor (Cs), a data writing unit and a light-emitting control unit. The other terminal of the capacitor (Cs) is connected to a first scan control line (Sn1). The initialization unit is connected to a second scan control line (Sn2). The data writing unit is connected to a third scan control line (Sn3) and a data line (Dm). The light-emitting control unit is connected to a fourth scan control line (Sn4). The AMOLED pixel unit (20) can effectively avoid an impact of leak currents or threshold voltage differences on the capacitors (Cs), allowing uniform light brightness of the AMOLED display device.

12 Claims, 5 Drawing Sheets

(51) Int. Cl.
*G09G 3/3275* (2016.01)
*H01L 27/32* (2006.01)
*G09G 3/3233* (2016.01)

(52) U.S. Cl.
CPC ....... *G09G 3/3275* (2013.01); *H01L 27/3244* (2013.01); *G09G 2300/0439* (2013.01); *G09G 2300/08* (2013.01); *G09G 2300/0819* (2013.01); *G09G 2300/0861* (2013.01); *G09G 2310/0251* (2013.01); *G09G 2310/0262* (2013.01); *G09G 2320/0233* (2013.01); *G09G 2320/045* (2013.01); *H01L 2227/32* (2013.01)

(58) Field of Classification Search
USPC .......................................................... 345/76
See application file for complete search history.

(56) References Cited

U.S. PATENT DOCUMENTS

| | | | |
|---|---|---|---|
| 2011/0084947 A1* | 4/2011 | Chung | G09G 3/3233 345/211 |
| 2011/0157126 A1 | 6/2011 | Chung et al. | |
| 2011/0279444 A1 | 11/2011 | Chung et al. | |
| 2012/0001896 A1* | 1/2012 | Han | G09G 3/3233 345/214 |
| 2013/0050292 A1 | 2/2013 | Mizukoshi | |
| 2013/0088165 A1 | 4/2013 | Wang et al. | |
| 2014/0175992 A1 | 6/2014 | Yang | |

FOREIGN PATENT DOCUMENTS

| | | |
|---|---|---|
| CN | 102903333 A | 1/2013 |
| CN | 102903333 A | 1/2013 |
| CN | 103000134 A | 3/2013 |
| CN | 103000134 A | 3/2013 |
| CN | 103035195 A | 4/2013 |
| CN | 103035195 A | 4/2013 |
| CN | 103218970 A | 7/2013 |
| CN | 203386460 U | 1/2014 |
| JP | 2004-252404 A | 9/2004 |
| JP | 2009-251590 A | 10/2009 |
| JP | 2009-258227 A | 11/2009 |
| JP | 2009-265328 A | 11/2009 |
| JP | 2009265328 | 11/2009 |
| JP | 2010-266848 A | 11/2010 |
| KR | 20090080269 A | 7/2009 |
| KR | 20090104319 A | 10/2009 |
| TW | 201108181 A | 3/2011 |
| WO | WO2011/013409 A1 | 2/2011 |

* cited by examiner

US 10,453,385 B2

AMOLED PIXEL UNIT AND DRIVING METHOD THEREFOR, AND AMOLED DISPLAY APPARATUS

TECHNICAL FIELD

The present invention relates to the field of flat panel display devices and, in particular, to an AMOLED pixel unit and a method for driving it, as well as to an AMOLED display device.

BACKGROUND

In recent years, various types of flat panel display devices lighter and smaller than cathode ray tube (CRT) screens have been developed. Among the different types of flat panel display devices, active-matrix organic light-emitting diode (AMOLED) display devices utilize self-light-emitting organic light-emitting diodes (OLEDs) to display images, resulting in a shortened response time, less drive power consumption, and relatively better brightness and color purity characteristics. Thus, OLED display devices have become the focus of the next generation display devices.

A large AMOLED display device includes a plurality of pixels at intersections between scan lines and data lines. Each pixel includes an OLED and a pixel circuit that drives the OLED. The pixel circuit typically includes a switch transistor, a drive transistor and a capacitor. As the properties of the pixels in the AMOLED display device are adversely affected by differences between the drive transistors as well as by leakage currents in the switch transistors, the images displayed using these pixels suffer from low uniformity and consistency in quality.

FIG. 1 is a circuit diagram of a conventional pixel in an AMOLED display device. As shown in FIG. 1, the conventional pixel 10 in the AMOLED display device includes an OLED 14 and a pixel circuit 12 that is connected to a data line Dm and a scan control line Sn in order to enable control of the OLED 14.

Specifically, the pixel circuit 12 includes a second transistor M2 (i.e., a drive transistor) connected between a first power source ELVDD and an anode of the OLED 14, a first transistor M1 (i.e, a switch transistor) connected between a gate of the second transistor M2 and the data line Dm, and a capacitor Cs connected between the gate of the second transistor M2 and the first power source ELVDD, wherein a gate of the first transistor M1 is connected to the scan control line Sn. The OLED 14 has an anode connected to the pixel circuit 12, and the OLED 14 has a cathode connected to a second power source ELVSS. The OLED 14 emits light whose brightness corresponds to a current supplied by the pixel circuit 12.

When a scan signal is provided to the scan control line Sn, the pixel circuit 12 controls the magnitude of a current supplied to the OLED 14 in correspondence to a data signal provided to the data line Dm. Specifically, the gate of the first transistor M1 is connected to the scan control line Sn, with a source (or drain) of the first transistor M1 connected to the data line Dm and the drain (or source) of the first transistor M1 connected to a terminal of the capacitor Cs. When a scan control signal is provided to the first transistor M1 from the scan control line Sn, the first transistor M1 is turned on, and the data signal provided to the data line Dm is then supplied to the capacitor Cs. One terminal of the capacitor Cs is connected to the gate of the second transistor M2, and the other terminal is connected to the first power source ELVDD. A voltage corresponding to the data signal is applied to the capacitor Cs. As a result, the voltage corresponding to the data signal is stored in the capacitor Cs.

The gate of the second transistor M2 is connected to the one terminal of the capacitor Cs, a source of the second transistor M2 is connected to the first power source ELVDD and a drain of the second transistor M2 is connected to the anode of the OLED 14. The second transistor M2 controls a current flowing from the first power source ELVDD, through the OLED 14, toward the second power source ELVSS. This current corresponds to the voltage stored in the capacitor Cs.

The conventional pixel 10 controls the brightness of the OLED 14 by providing the OLED 14 with the current that corresponds to the voltage applied to the capacitor Cs and thereby displays an image with predetermined brightness. However, due to differences between threshold voltages of the second transistors M2 as well as leakage currents in the first transistors M1, it is a challenge for the conventional AMOLED display device to display an image with uniform brightness.

For example, due to the differences between threshold voltages of the second transistors M2 in different pixels, the application of the same gate drive voltage leads to different currents flowing through the OLEDs and hence their different brightness levels. Since the pixels produce non-uniformly bright light in response to the same data signal, an image with uniform brightness is hardly obtainable.

SUMMARY OF THE INVENTION

It is an objective of the present invention to provide an active-matrix organic light-emitting diode (AMOLED) pixel unit and a driving method therefor, as well as an AMOLED display device, in order to address the above described problem of non-uniform brightness arising from the use of the conventional AMOLED display device.

This objective is attained by an AMOLED pixel unit according to the present invention, which is used to be connected to a first scan control line, a second scan control line, a third scan control line, a fourth scan control line and a data line. The AMOLED pixel unit includes a pixel circuit and an organic light-emitting diode connected to the pixel circuit. The pixel circuit includes a capacitor, and an initialization unit, a data writing unit and a light-emitting control unit each connected to a first terminal of the capacitor, wherein the capacitor has a second terminal connected to the first scan control line; the initialization unit is connected to the second scan control line; the data writing unit is connected to the third scan control line and the data line; and the light-emitting control unit is connected to the fourth scan control line.

Optionally, in the AMOLED pixel unit, the initialization unit may include a first transistor and a seventh transistor, wherein a source/drain of the first transistor is connected to a drain/source of the seventh transistor; both a gate of the first transistor and a gate of the seventh transistor is connected to the second scan control line; and the source/drain of the seventh transistor is connected to the first terminal of the capacitor.

Optionally, in the AMOLED pixel unit, the drain/source of the first transistor may be connected to the third scan control line or a first power source.

Optionally, in the AMOLED pixel unit, the data writing unit may include a second transistor, a third transistor, a fourth transistor and an eighth transistor, wherein a source/drain of the second transistor is connected to a drain/source of the third transistor; the drain/source of the second transistor is connected to the data line; both a gate of the third transistor and a source/drain of the fourth transistor is connected to the first terminal of the capacitor; the drain/source of the fourth transistor is connected to a source/drain of the eighth transistor; and both a gate of the fourth transistor and a gate of the eighth transistor is connected to the third scan control line.

Optionally, in the AMOLED pixel unit, the light-emitting control unit may include a fifth transistor, the third transistor and a sixth transistor, wherein a source/drain of the fifth transistor is connected to the drain/source of the third transistor; the drain/source of the fifth transistor is connected to the first power source; a gate of the fifth transistor is connected to the fourth scan control line; the source/drain of the third transistor is connected to a drain/source of the sixth transistor; and a gate of the sixth transistor is connected to the fourth scan control line.

Optionally, in the AMOLED pixel unit, the organic light-emitting diode may have an anode connected to the source/drain of the sixth transistor and a cathode connected to a second power source, wherein the first power source has a voltage that is higher than a voltage of the second power source.

Optionally, in the AMOLED pixel unit, the first transistor, the second transistor, the third transistor, the fourth transistor, the fifth transistor, the sixth transistor, the seventh transistor and the eighth transistor may all be PMOS transistors or NMOS transistors.

The present invention also provides a method for driving an AMOLED pixel unit, including:

an initialization phase, in which a scan control signal is provided to a first scan control line and a second scan control line, thereby turning on an initialization unit and enabling initialization of a gate of a third transistor;

a data writing phase, in which a scan control signal is provided to a third scan control line, thereby turning on a data writing unit and storing a voltage corresponding to a data signal in a capacitor; and a light-emission phase, in which a scan control signal is provided to a fourth scan control line, thereby turning on a light-emitting control unit and enabling light-emission of an organic light-emitting diode.

Optionally, in the method:

in the initialization phase, following the scan control signal being provided to the first scan control line and the second scan control line, the gate of the third transistor may be initialized via a first transistor and a seventh transistor;

in the data writing phase, following the scan control signal being provided to the third scan control line, the voltage corresponding to the data signal may be stored in the capacitor via a second transistor, a third transistor, a fourth transistor and an eighth transistor; and in the light-emission phase, following the scan control signal being provided to the fourth scan control line, the organic light-emitting diode may be lighted via a fifth transistor, the third transistor and a sixth transistor.

The present invention also provides an AMOLED display device, including a plurality of AMOLED pixel units as defined above, a scan driver, a data driver and a plurality of data lines, wherein the plurality of AMOLED pixel units which are arranged in an array are connected to the scan driver via first scan control lines, second scan control lines, third scan control lines and fourth scan control lines and are connected to the data driver via the plurality of data lines. In the AMOLED pixel unit, the method and the AMOLED display device, according to the present invention, through initialization, by the initialization unit, of the gate of the third transistor, storage, by the data writing unit, of the voltage corresponding to the data signal in the capacitor, and enabling, by the light-emitting control unit, of light-emission of the organic light-emitting diode, an impact of leak currents or threshold voltage differences on the capacitors is avoided, allowing uniform brightness of the AMOLED display device.

DETAILED DESCRIPTION

AMOLED pixel units and driving methods thereof, as well as AMOLED display devices, according to the present invention, will be described below with reference to specific embodiments and the accompanying drawings. The advantages and feature of the invention will become more apparent from the following description and the appended claims. It is noted that the drawings are presented in a very simplified form not precisely drawn to scale with the only purpose of facilitating clear description of the embodiments of the invention.

Figure 1:
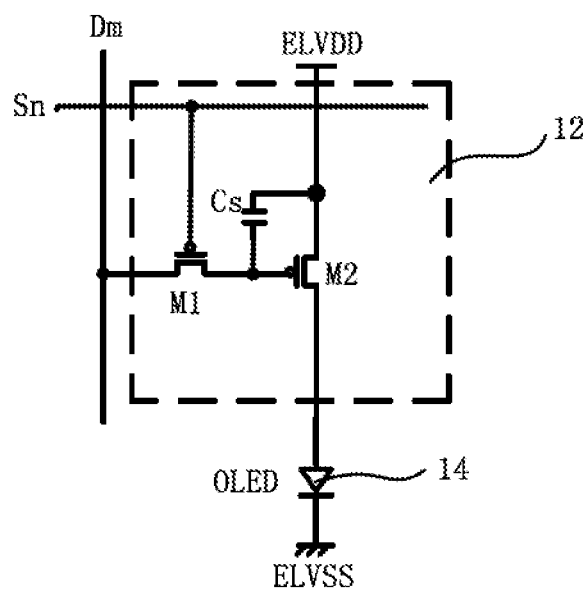
FIG. 1 is a circuit diagram of a conventional pixel in an AMOLED display.
Figure 2:
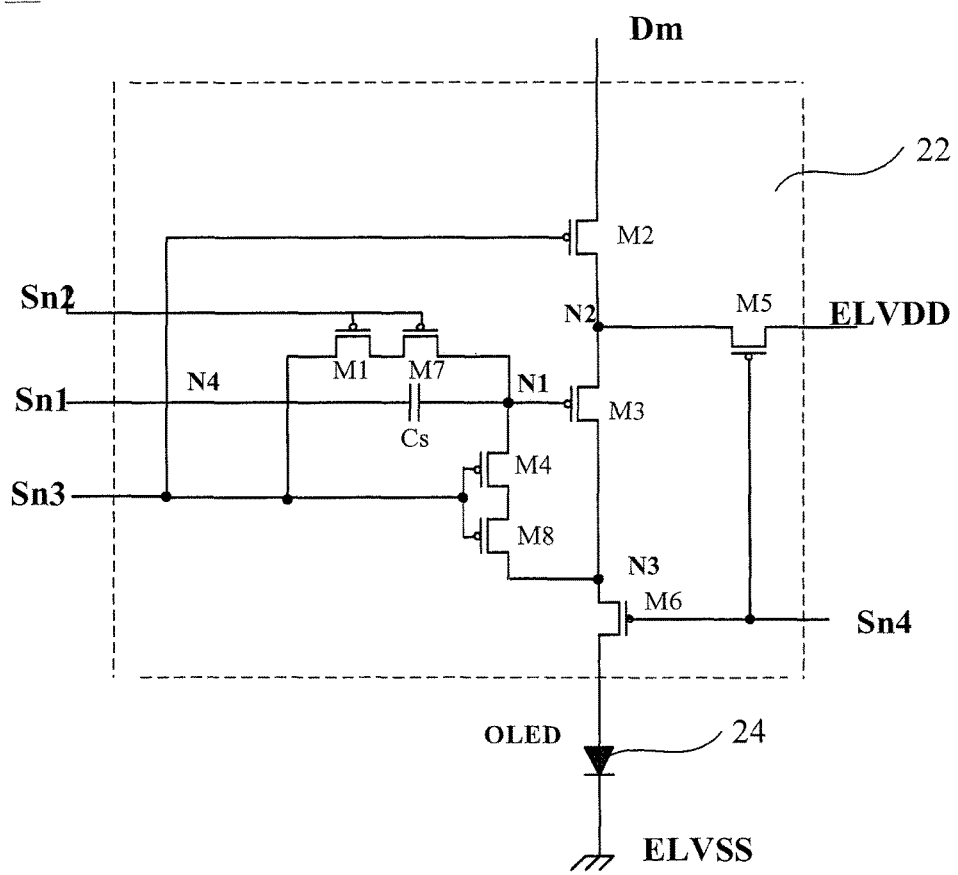
FIG. 2 shows a circuit diagram of an AMOLED pixel unit in accordance with an embodiment of the present invention.

FIG. 2 shows a circuit diagram of an AMOLED pixel unit in accordance with an embodiment of the present invention. As shown in FIG. 2, the AMOLED pixel unit 20 is connected to scan control lines including a first scan control line Sn1, a second scan control line Sn2, a third scan control line Sn3 and a fourth scan control line Sn4. The AMOLED pixel unit 20 includes a pixel circuit 22 and an organic light-emitting diode (OLED) 24 connected to the pixel circuit 22. The pixel circuit 22 includes a capacitor Cs, and an initialization unit, a data writing unit and a light-emitting control unit each connected to one terminal of the capacitor Cs, wherein the other terminal of the capacitor Cs is connected to the first scan control line Sn1; the initialization unit is connected to the second scan control line Sn2; the data writing unit is connected to the third scan control line Sn3 and the data line Dm; and the light-emitting control unit is connected to the fourth scan control line Sn4.

Figure 3:
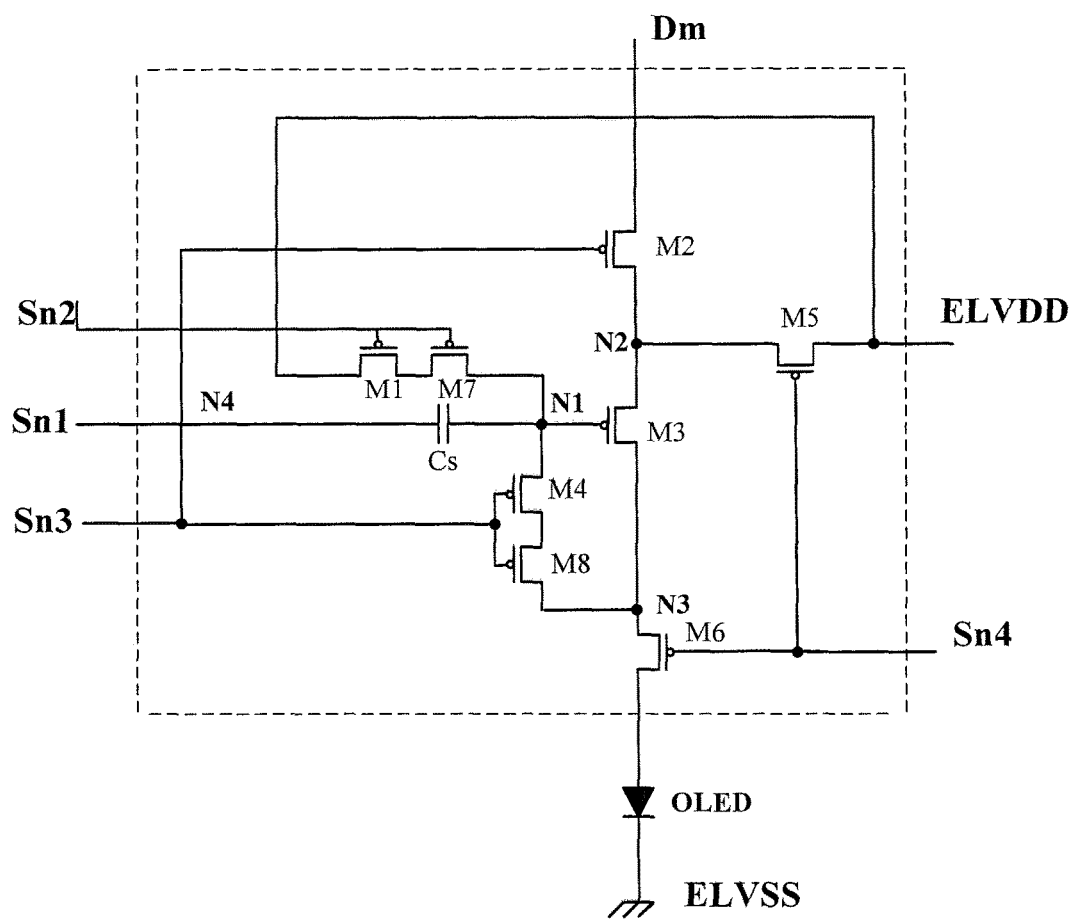
FIG. 3 shows a circuit diagram of an AMOLED pixel unit in accordance with another embodiment of the present invention.

Specifically, the initialization unit includes a first transistor M1 and a seventh transistor M7 having a drain/source connected to a source/drain of the first transistor M1 (i.e., the first transistor M1 is connected in series to the seventh transistor M7). A gate of the first transistor M1, together with a gate of the seventh transistor M7, is connected to the second scan control line Sn2. The source/drain of the seventh transistor M7 is connected to one terminal of the capacitor Cs. In this embodiment, the drain/source of the first transistor M1 is connected to the third scan control line Sn3. In another embodiment, the drain/source of the first transistor M1 may be connected to a first power source ELVDD, as shown in FIG. 3 for example.

The data writing unit includes a second transistor M2, a third transistor M3, a fourth transistor M4 and an eighth transistor M8. A source/drain of the second transistor M2 is connected to a drain/source of the third transistor M3, and the drain/source of the second transistor M2 is connected to the data line Dm. A gate of the third transistor M3, together with a source/drain of the fourth transistor M4, is connected to one terminal of the capacitor, and the drain/source of the fourth transistor M4 is connected to a source/drain of the eighth transistor M8 (i.e., the fourth transistor M4 is connect in series to the eighth transistor M8). A gate of the fourth transistor M4, together with a gate of the eighth transistor M8, is connected to the third scan control line Sn3.

The light-emitting control unit includes a fifth transistor M5, the third transistor M3 and a sixth transistor M6. A source/drain of the fifth transistor M5 is connected to the drain/source of the third transistor M3, and the drain/source of the fifth transistor M5 is connected to the first power source ELVDD. A gate of the fifth transistor M5 is connected to the fourth scan control line Sn4. The source/drain of the third transistor M3 is connected to a drain/source of the sixth transistor M6. A gate of the sixth transistor M6 is connected to the fourth scan control line Sn4.

In order to better describe changes in levels occurring at several nodes in the pixel circuit 22, a node among the capacitor Cs, the third transistor M3, the fourth transistor M4 and the seventh transistor M7 is indicated at N1; a node among the second transistor M2, the third transistor M3 and the fifth transistor M5 is indicated at N2; a node among the third transistor M3, the sixth transistor M6 and the eighth transistor M8 is indicated at N3; and a node between the capacitor Cs and the first scan control line Sn1 is indicated at N4.

In this embodiment, an anode of the OLED 24 is connected to the source/drain of the sixth transistor M6, and a cathode of the OLED 24 is connected to a second power source ELVSS, wherein a voltage of the first power source ELVDD is higher than a voltage of the second power source ELVSS.

In this embodiment, the first transistor M1, the second transistor M2, the third transistor M3, the fourth transistor M4, the fifth transistor M5, the sixth transistor M6, the seventh transistor M7 and the eighth transistor M8 are all PMOS transistors or NMOS transistors.

In the following description, operation of the AMOLED pixel unit 20 will be described with the transistor M1, the second transistor M2, the third transistor M3, the fourth transistor M4, the fifth transistor M5, the sixth transistor M6, the seventh transistor M7 and the eighth transistor M8 being all implemented as PMOS transistors as an example.

In this embodiment, a method for driving the AMOLED pixel unit 20 includes:

an initialization phase, in which a scan control signal is provided to the first scan control line and the second scan control line, thereby turning the initialization unit on and enabling initialization of the gate of the third transistor;

a data writing phase, in which a scan control signal is provided to the third scan control line, thereby turning the data writing unit on and enabling storage of a voltage corresponding to a data signal in the capacitor; and a light-emission phase, in which a scan control signal is provided to the fourth scan control line, thereby turning the light-emitting control unit on and enabling light-emission of the OLED.

Figure 4:
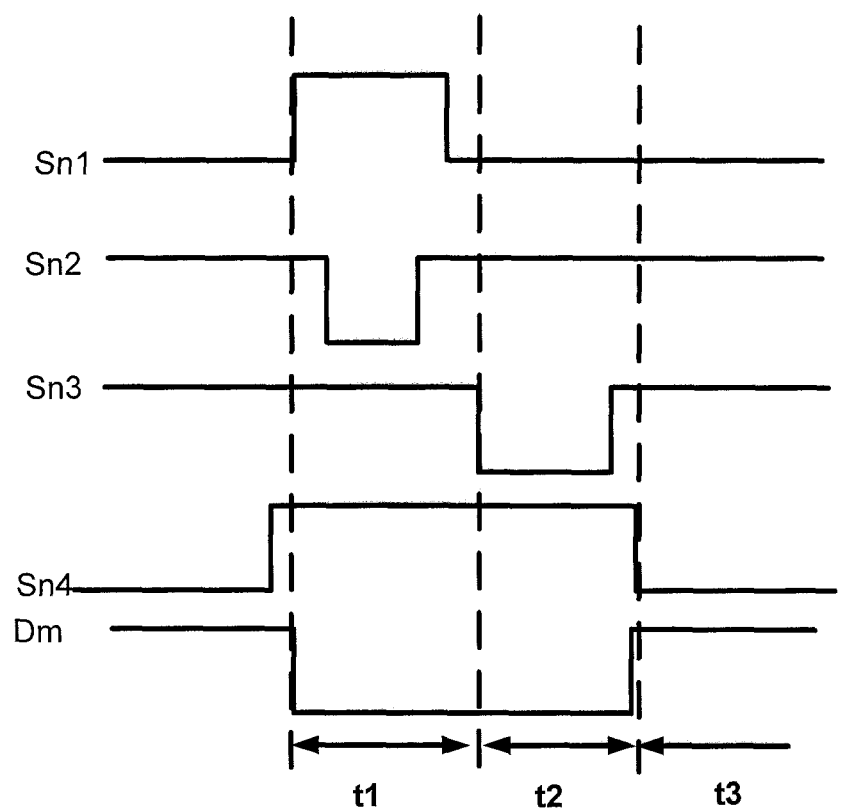
FIG. 4 is a timing chart of a drive signal in an AMOLED pixel unit according to the present invention.

In particular, reference is made to FIGS. 4 and 2, in which FIG. 4 is a timing chart of a drive signal in the AMOLED pixel unit in accordance with the embodiment of the present invention. In the figure, only one frame of the drive signal is shown.

Specifically, in a first period of time t1 corresponding to the initialization phase, a signal with a high level is coupled to the first scan control line Sn1, the third scan control line Sn3 and the fourth scan control line Sn4, and a signal with a low level is coupled to the second scan control line Sn2. Subsequently, the signal coupled to the second scan control line Sn2 jumps to the high level, and the signal coupled to the first scan control line Sn1 jumps to the low level. In this way, jumping of the signal coupled to the first scan control line Sn1 from the low level to the high level pulls up a level at the node N1, enabling a high level at the node N4. The first transistor M1 and the seventh transistor M7 are turned on under the effect of the low level of the signal coupled to the second scan control line Sn2, resulting in the high level signal coupled to the third scan control line Sn3 being provided to the node N1. The subsequent jumping of the signal coupled to the second scan control line Sn2 to the high level causes the first transistor M1 and the seventh transistor M7 to be turned off, and the jumping of the signal coupled to the first scan control line Sn1 from the high level to the low level pulls the level at the node N1 down, taking the advantage that the voltage difference between the two terminals of the capacitor cannot change during this transient process.

During the first period of time t1, the level at the node N1 can be pulled up with the aid of the first transistor M1 and the seventh transistor M7, and then the level at the node N1 can be pulled down by coupling of the capacitor Cs. This allows consistent recovery of the first node N1 in each frame.

Afterward, in a second period of time t2 corresponding to the data writing phase, a signal with the low level is coupled to the third scan control line Sn3. In response to the signal with the low level of the third scan control line Sn3, the second transistor M2, the fourth transistor M4 and the eighth transistor M8 are turned on. The eighth transistor M8 and the fourth transistor M4 then act together to turn on the third transistor M3 (herein, the third transistor M3 functions as a diode). Because the first node N1 has been initialized in the first period of time t1, the third transistor M3 is forward connected as a diode.

In this way, with the aid of the second transistor M2, the eighth transistor M8 and the fourth transistor M4, a data signal Vm provided to the data line Dm is further provided to the second node N2. At this point, since the third transistor M3 is connected as a diode, a voltage corresponding to the difference between a voltage of the data signal Vm and the threshold voltage of the third transistor M3 is supplied to the first node N1. The voltage provided to the second node N2 thereby charges the capacitor Cs.

Thereafter, in a third period of time t3 corresponding to the light-emission phase, the signal coupled to the fourth scan control line Sn4 jumps from the high level to the low level. The fifth transistor M5 and the sixth transistor M6 are then turned on under the effect of the signal coupled to the fourth scan control line Sn4. As a result, a drive current flows along a path leading from the first power source ELVDD and passing through the fifth transistor M5, the third transistor M3, the sixth transistor M6 and the OLED 24 and reaches the second power source ELVSS, thereby causing the OLED 24 to emit light.

Wherein, the third transistor M3 responds to the storage of a provided voltage corresponding to the threshold voltage of the third transistor M3 in the capacitor Cs, so that the threshold voltage of the third transistor M3 is compensated for during the second period of time t2. Meanwhile, during the third period of time t3, the first transistor M1 is coupled to the high level output by the third scan control line Sn3 (for the AMOLED pixel unit of FIG. 3, the first transistor M1 is coupled to the first power source ELVDD, and optionally, the first transistor M1 may also be coupled to other high level signals). During the third period of time t3, there are predominantly two current paths connected to the N1 node which may undergo electrical leakage, one of which passes through the first transistor M1 and the seventh transistor M7, and the other passes through the fourth transistor M4 and the eighth transistor M8. By connecting the source of the first transistor M1 (acting as a switch transistor) to the high level, leak currents at the N1 node can be reduced. In addition, during the periods of time when the fourth scan control line Sn4 is provided with a high level scan control signal, i.e., the first period of time t1 and the second period of time t2, the sixth transistor M6 is cut off, preventing the drive current from being provided to the OLED 24.

As described above, through initialization, by the initialization unit, of the gate of the drive transistor (i.e., the gate of the third transistor), storage, by the data writing unit, of the voltage corresponding to the data signal in the capacitor, and enabling, by the light-emitting control unit, of light-emission of the OLED, an impact of leak currents or threshold voltage differences on the capacitors is avoided, allowing uniform brightness of an AMOLED display device in which the pixel unit is incorporated.

Figure 5:
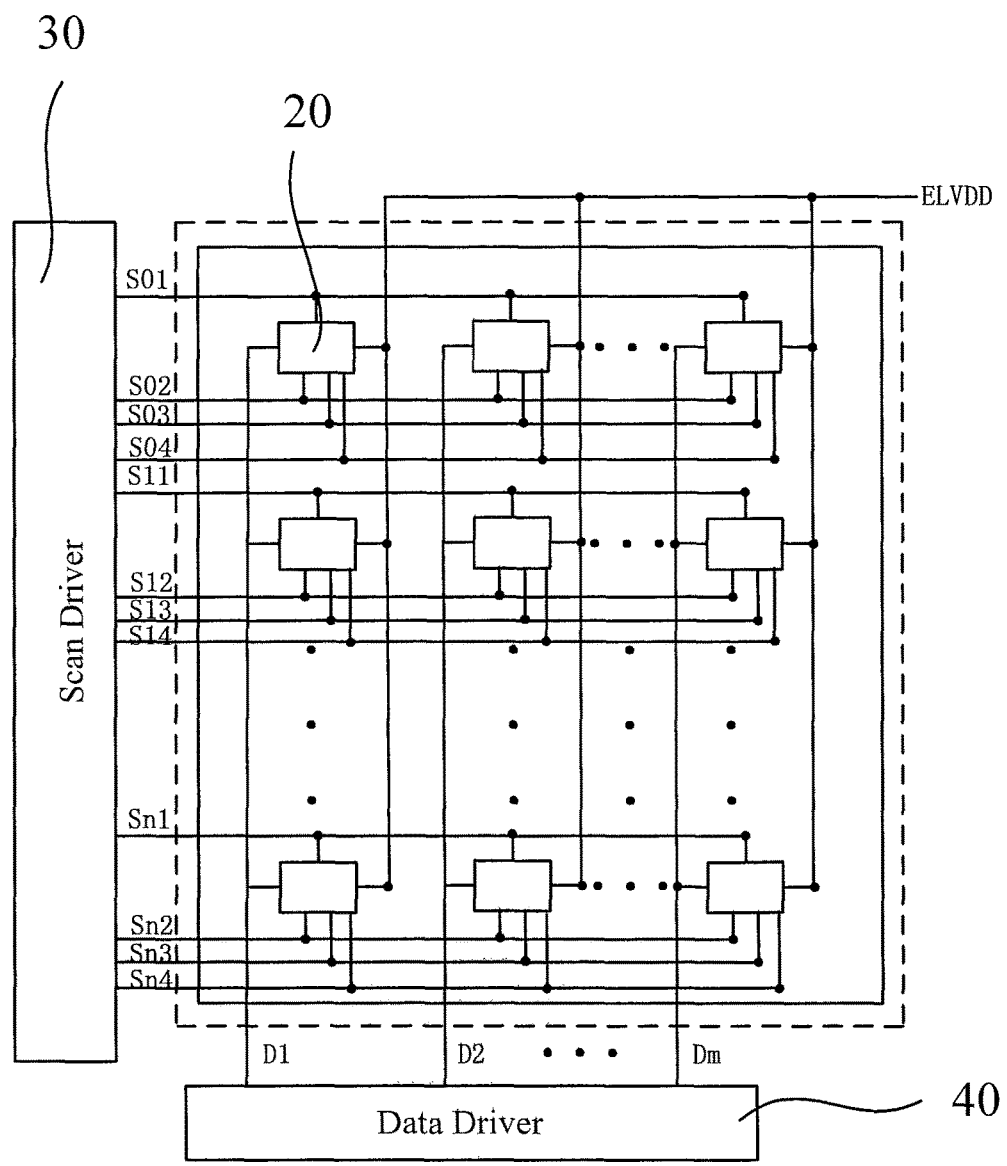
FIG. 5 is a schematic block diagram of an AMOLED display device in accordance with an embodiment of the present invention.

Accordingly, the present invention further provides an AMOLED display device. Specifically, referring to FIG. 5 which is a schematic block diagram of an AMOLED display device in accordance with an embodiment of the present invention, as shown in FIG. 5, the AMOLED display device includes: a plurality of AMOLED pixel units 20 as defined above, a scan driver 30 and a data driver 40. The plurality of AMOLED pixel units 20 are arranged in an array and are all connected to the scan driver 30 by first scan control lines, second scan control lines, third scan control lines and fourth scan control lines (S01, S02, S03, S04, S11, S12, S13, S14, . . . , Sn1, Sn2, Sn3, Sn4). The plurality of AMOLED pixel units 20 are also connected to the data driver 40 by data lines (D1, D2, . . . , Dm).

Wherein, the scan driver 30 produces a scan control signal corresponding to a scan control signal supplied by an external source (e.g., timing control unit). The scan control signal produced by the scan controller 30 is provided to the AMOLED pixel units 20 in a time sequence via the first scan control lines, the second scan control lines, the third scan control lines and the fourth scan control line.

The data driver 40 produces a data signal corresponding to a data control signal supplied by an external source (e.g., timing control unit). The data signal produced by the data driver 40 is provided in synchronization with the scan control signal to the AMOLED pixel units 20 via the data lines D1-Dm.

In each of the AMOLED pixel units 20, through initialization, by the initialization unit, of the gate of the third transistor, storage, by the data writing unit, of the voltage corresponding to the data signal in the capacitor, and enabling, by the light-emitting control unit, of light-emission of the OLED, an impact of leak currents or threshold voltage differences on the capacitors is avoided, allowing uniform brightness of the AMOLED display device.

The foregoing description is merely preferred embodiments of the present invention and does not limit the scope of the invention in any way. All changes and modifications made light of the foregoing disclosure by those of ordinary skill in the art fall within the scope of the appended claims.

What is claimed is:

1. An active-matrix organic light-emitting diode (AMOLED) pixel unit used to be connected to a first scan control line, a second scan control line, a third scan control line, a fourth scan control line and a data line, wherein the AMOLED pixel unit comprises a pixel circuit and an organic light-emitting diode connected to the pixel circuit, and wherein the pixel circuit comprises a capacitor, a first transistor, a second transistor, a third transistor, a fourth transistor, a fifth transistor, a sixth transistor, a seventh transistor and an eighth transistor, the first transistor having a source/drain connected to a drain/source of the seventh transistor, the first transistor having a gate connected, together with a gate of the seventh transistor, to the second scan control line, the source/drain of the seventh transistor being connected to a first terminal of the capacitor, the capacitor having a second terminal connected to the first scan control line, the second transistor having a source/drain connected to a drain/source of the third transistor, the drain/source of the second transistor being connected to the data line, the third transistor having a gate connected, together with a source/drain of the fourth transistor, to the first terminal of the capacitor, the drain/source of the fourth transistor being connected to a source/drain of the eighth transistor, the fourth transistor having a gate connected, together with a gate of the eighth transistor, to the third scan control line, the fifth transistor having a source/drain connected to the drain/source of the third transistor, the drain/source of the fifth transistor being connected to a first power source, the fifth transistor having a gate connected to the fourth scan control line, the source/drain of the third transistor being connected to a drain/source of the sixth transistor, the sixth transistor having a gate connected to the fourth scan control line, wherein the drain/source of the first transistor is directly connected to the third scan control line.

2. The AMOLED pixel unit of claim 1, wherein the organic light-emitting diode has an anode connected to the source/drain of the sixth transistor and a cathode connected to a second power source, and wherein the first power source has a voltage higher than a voltage of the second power source.

3. The AMOLED pixel unit of claim 1, wherein the first transistor, the second transistor, the third transistor, the fourth transistor, the fifth transistor, the sixth transistor, the seventh transistor and the eighth transistor are all PMOS transistors or NMOS transistors.

4. An active-matrix organic light-emitting diode (AMOLED) display device, comprising a plurality of AMOLED pixel units as defined in claim 1, a scan driver, a data driver and a plurality of data lines, wherein the plurality of AMOLED pixel units which are arranged in an array are connected to the scan driver by first scan control lines, second scan control lines, third scan control lines and fourth scan control lines and are connected to the data driver by the plurality of data lines.

5. The AMOLED display device of claim 4, wherein the organic light-emitting diode has an anode connected to the source/drain of the sixth transistor and a cathode connected to a second power source, and wherein the first power source has a voltage higher than a voltage of the second power source.

6. The AMOLED display device of claim 4, wherein the first transistor, the second transistor, the third transistor, the fourth transistor, the fifth transistor, the sixth transistor, the seventh transistor and the eighth transistor are all PMOS transistors or NMOS transistors.

7. The AMOLED pixel unit of claim 1, wherein a node among the capacitor, the third transistor, the fourth transistor and the seventh transistor is defined as node N1, in an initialization phase, a level at the node N1 is pulled up with an aid of the first transistor and the seventh transistor, and then the level at the node N1 is pulled down by coupling of the capacitor.

8. The AMOLED pixel unit of claim 7, wherein in a data writing phase, a third scan control signal with a low level is coupled to the third scan control line, in response to the third scan control signal with the low level of the third scan control line, the second transistor, the fourth transistor and the eighth transistor are turned on, the eighth transistor and the fourth transistor then act together to turn on the third transistor.

9. The AMOLED pixel unit of claim 8, wherein in a light-emission phase, a fourth scan control signal coupled to the fourth scan control line jumps from a high level to a low level, the fifth transistor and the sixth transistor are then turned on under an effect of the fourth scan control signal coupled to the fourth scan control line.

10. A method for driving an active-matrix organic light-emitting diode (AMOLED) pixel unit, wherein the AMOLED pixel unit comprises a pixel circuit and an organic light-emitting diode connected to the pixel circuit, and wherein the pixel circuit comprises a capacitor, a first transistor, a second transistor, a third transistor, a fourth transistor, a fifth transistor, a sixth transistor, a seventh transistor and an eighth transistor, the first transistor having a source/drain connected to a drain/source of the seventh transistor, the first transistor having a gate connected, together with a gate of the seventh transistor, to the second scan control line, the source/drain of the seventh transistor being connected to a first terminal of the capacitor, the capacitor having a second terminal connected to the first scan control line, the second transistor having a source/drain connected to a drain/source of the third transistor, the drain/source of the second transistor being connected to the data line, the third transistor having a gate connected, together with a source/drain of the fourth transistor, to the first terminal of the capacitor, the drain/source of the fourth transistor being connected to a source/drain of the eighth transistor, the fourth transistor having a gate connected, together with a gate of the eighth transistor, to the third scan control line, the fifth transistor having a source/drain connected to the drain/source of the third transistor, the drain/source of the fifth transistor being connected to a first power source, the fifth transistor having a gate connected to the fourth scan control line, the source/drain of the third transistor being connected to a drain/source of the sixth transistor, the sixth transistor having a gate connected to the fourth scan control line, wherein the drain/source of the first transistor is directly connected to the third scan control line, the method comprising:

an initialization phase, in which a first scan control signal and a second scan control signal are provided to the first scan control line and the second scan control line respectively, thereby enabling initialization of the gate of the third transistor;

a data writing phase, in which a third scan control signal is provided to the third scan control line, thereby enabling storage of a voltage corresponding to a data signal in the capacitor; and a light-emission phase, in which a fourth scan control signal is provided to the fourth scan control line, thereby enabling light-emission of the organic light-emitting diode.

11. The method of claim 10, wherein:

in the initialization phase, following the first scan control signal and the second scan control signal being provided to the first scan control line and the second scan control line respectively, the gate of the third transistor is initialized via the first transistor and the seventh transistor, in the data writing phase, following the third scan control signal being provided to the third scan control line, the voltage corresponding to the data signal is stored in the capacitor via the second transistor, the third transistor, the fourth transistor and the eighth transistor, and in the light-emission phase, following the fourth scan control signal being provided to the fourth scan control line, the light-emission of the organic light-emitting diode is enabled via the fifth transistor, the third transistor and the sixth transistor.

12. The method of claim 10, wherein a node among the capacitor, the third transistor, the fourth transistor and the seventh transistor is defined as node N1, in the initialization phase, a level at the node N1 is pulled up with an aid of the first transistor and the seventh transistor, and then the level at the node N1 is pulled down by coupling of the capacitor.

* * * * *